United States Patent [19]
Runaldue et al.

[11] Patent Number: 6,108,342
[45] Date of Patent: *Aug. 22, 2000

[54] MANAGEMENT INFORMATION BASE (MIB) ACCUMULATION PROCESSOR

[75] Inventors: Thomas Jefferson Runaldue, San Jose; Bahadir Erimli, Mountain View, both of Calif.

[73] Assignee: Advanced Micro Devices, Inc., Sunnyvale, Calif.

[*] Notice: This patent is subject to a terminal disclaimer.

[21] Appl. No.: 08/992,919

[22] Filed: Dec. 18, 1997

Related U.S. Application Data

[60] Provisional application No. 60/038,025, Feb. 14, 1997.

[51] Int. Cl.[7] ......................................................... H04J 3/12
[52] U.S. Cl. ............................................. 370/426; 370/422
[58] Field of Search .................................. 370/401, 402, 370/404, 412, 413, 414, 415, 416, 417, 418, 422, 426, 229, 230, 231, 360, 363, 423, 424, 425; 379/229; 395/200.3, 200.79, 200.8

[56] References Cited

U.S. PATENT DOCUMENTS

| | | | |
|---|---|---|---|
| 5,455,827 | 10/1995 | Krause et al. | |
| 5,515,376 | 5/1996 | Merthy et al. | |
| 5,724,353 | 3/1998 | Sugawara | 390/395 |
| 5,742,762 | 4/1998 | Scholl et al. | 395/200.3 |

FOREIGN PATENT DOCUMENTS

WO 95/22216  8/1995  WIPO .

OTHER PUBLICATIONS

Wright, M., "Network–switch ICs simplify design and slash per–port costs" EDN–Electrical Design News, vol. 40, No. 24, Nov. 23, 1995, pp. 53–56, 58 and 60, XP000546015.

De Souza, E., "Emerging Architectures for 10Base T Environments", Weson Technical Papers, vol. 35, Nov. 1, 1991, pp. 222–228, XP000320540.

Newman, D. et al, "Ethernet Switches: Quantity, Not Commodity" Data Communication, vol. 25, No. 15, Nov. 1996, pp. 85–94, 96, 98, XP000639962.

Boden, N.J. et al., "Myrinet: A Gigabit–per–second Local Area Network", IEEE Micro, vol. 15, No. 1, Feb. 1995, pp. 29–36, XP000501486.

*Primary Examiner*—Huy D. Vu

[57] ABSTRACT

An integrated multiport switch (IMS) in which an on-chip management information base (MIB) accumulation processor enables monitoring of a significantly larger number of MIB objects to be stored in external memory while minimizing media access controller (MAC) complexity. A MAC for each port in the IMS outputs a MIB report for each transmission or reception of data according to a specific encoded format to a MIB engine. The MIB engine decodes the MIB report into a plurality of associated MIB objects, which are temporarily accumulated until the external memory is updated. The MIB engine initiates the stored MIB value updating process by retrieving the values from the external memory and adding the accumulated MIB objects to the retrieved values. The updated MIB objects are then transmitted back to the external memory for storage therein and the MIB engine object values are reset.

10 Claims, 6 Drawing Sheets

MANAGEMENT INFORMATION BASE (MIB) ACCUMULATION PROCESSOR

RELATED APPLICATIONS

This application claims priority from provisional patent application Ser. No. 60/038,025, filed Feb. 14, 1997, the entire disclosure of which is hereby incorporated by reference herein.

TECHNICAL FIELD

The present invention relates to network switching and, more particularly, to the accumulation of Management Information Base objects (MIBs) on a data network switch logic chip.

BACKGROUND ART

A data network switch permits data communication among a plurality of media stations in a local area network. Data frames, or packets, are transferred between stations by means of data network switch media access control (MAC). The network switch passes data frames received from a transmitting station to a destination station based on the header information in the received data frame.

Packet transmission events typically are tracked to provide a basis for statistical analysis of network operation with respect to each data network switch port. For example, the number of transmitted packets, received packets, transmission collisions and the like can be counted and polled periodically. These significant parameters, termed objects, are collected in a Management Information Base (MIB). Through the use of statistical counters, determination can be made of improper device operation such as, for example, loss of packets.

Conventionally, each MAC unit includes internal counters of limited capacity for counting a small number of MIB objects. Flip-flops are incremented each time an item is changed. The counted objects are output to readable registers, then to be appended to data packets in a MAC transmit operation. The increased MAC complexity owing to these components, coupled with the relatively limited MIB reporting functionality for this scheme, are significant disadvantages. Later versions provide a RAM based memory on the switch logic chip as a full counter for MIB data received from all of the MACs on the chip. Incorporation of a large capacity RAM in the switch logic chip to accommodate MIB data objects from all ports incurs undesirable expense. As the number of poled MIB objects increases to keep up with expanding statistical requirements, available RAM capacity must meet these needs. Space constraints inherent in the integration of the various elements on a single logic chip impose additional disadvantages.

DISCLOSURE OF THE INVENTION

In view of the limitations described above, the need exists for effectively satisfying the expanding requirements for provision of MIB data from a network switch. Such requirements stem not only from the large number of ports and usage that can be expected from future implementations, but from the greater number of network operational parameters that will be monitored.

An arrangement is needed that can supply these required MIB data objects while performing in an efficient manner from the standpoint of accuracy, speed and expense. Such an arrangement should be able to perform real time functions on the data network switch chip without occupying an inordinate amount of chip architecture.

The present invention addresses the above noted needs by providing an improved data network switch architecture in which an on-chip MIB accumulation processor enables monitoring of a significantly larger number of MIB objects to be stored in external memory while minimizing MAC complexity. In accordance with the invention, an Integrated Multiport Switch (IMS) includes all logic components on a single chip. A MAC for each port in the switch outputs a MIB report for each transmission or reception of data according to a specific encoded format to a MIB engine. The MIB engine decodes the MIB report into a plurality of associated MIB objects, which are temporarily accumulated until the external memory is updated. The MIB engine initiates the stored MIB value updating process by retrieving the values from the external memory and adding the accumulated MIB objects to the retrieved values. The updated MIB objects are then transmitted back to the external memory for storage therein and the MIB engine object values are reset.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

BEST MODE FOR CARRYING OUT THE INVENTION

Figure 1:
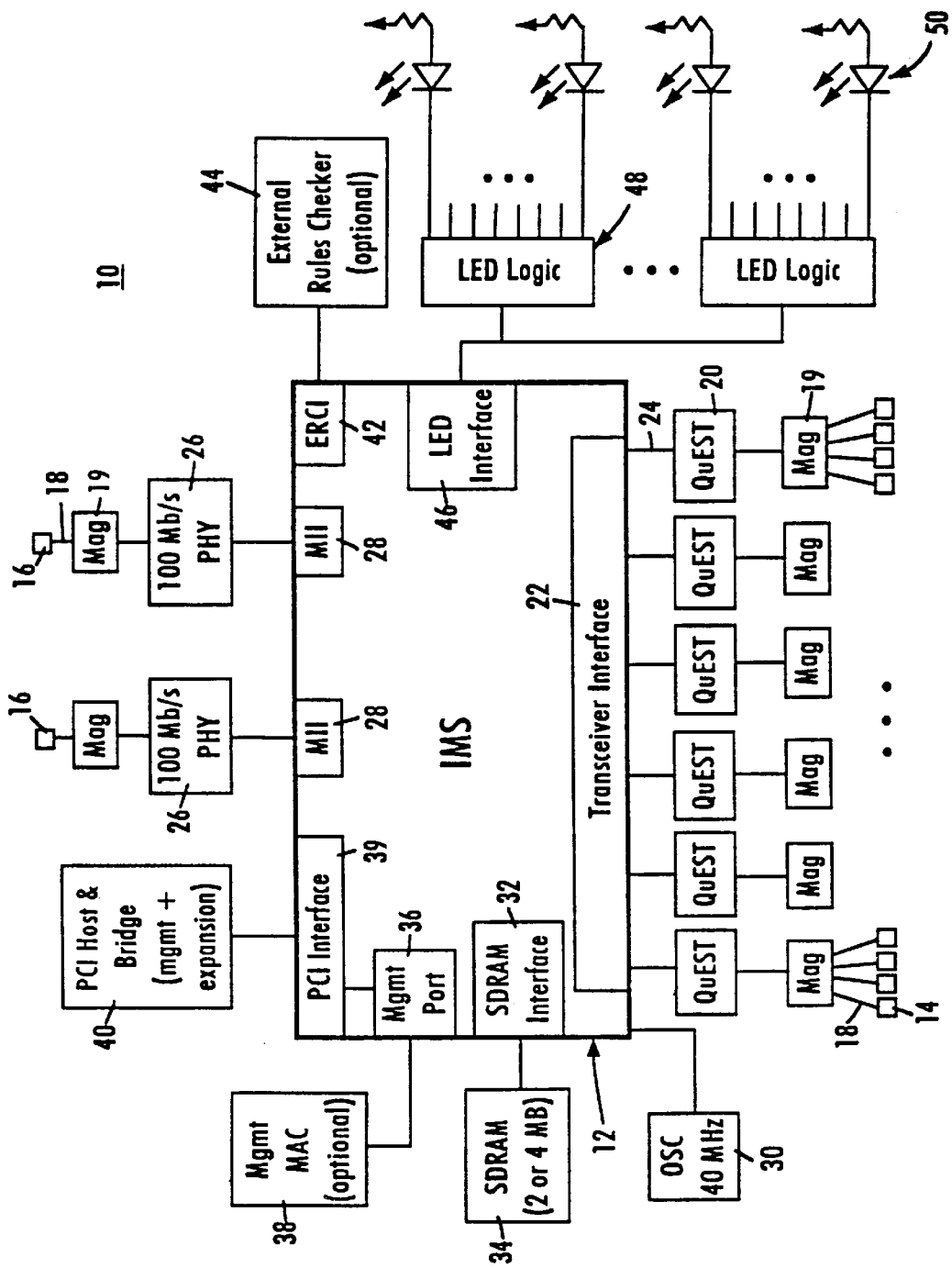
FIG. 1 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 1, is also applicable to other packet switched systems. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol.

As shown in FIG. 1, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of pins required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mbytes.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal rules checker or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2:
FIG. 2 is a block diagram of a multiport switch used in the packet switched system of FIG. 1.
Figure 2A:
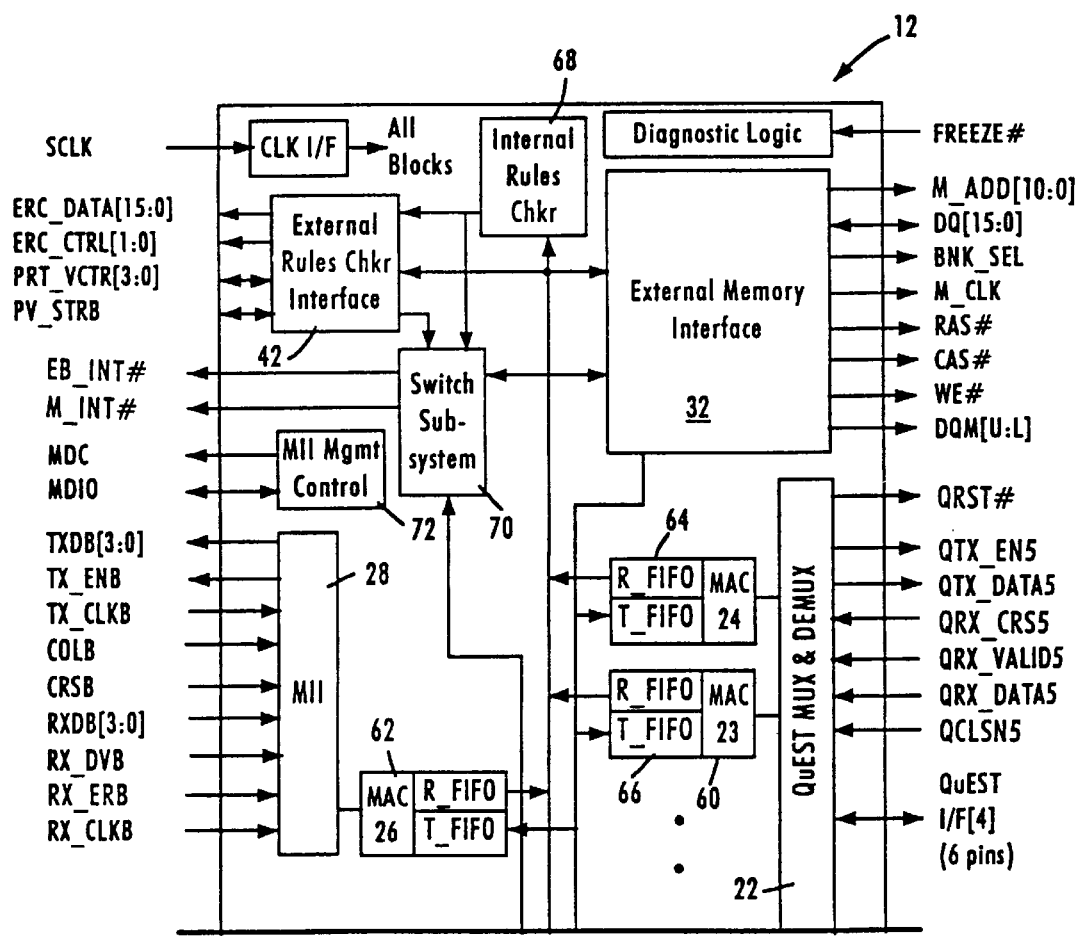
Figure 2B:
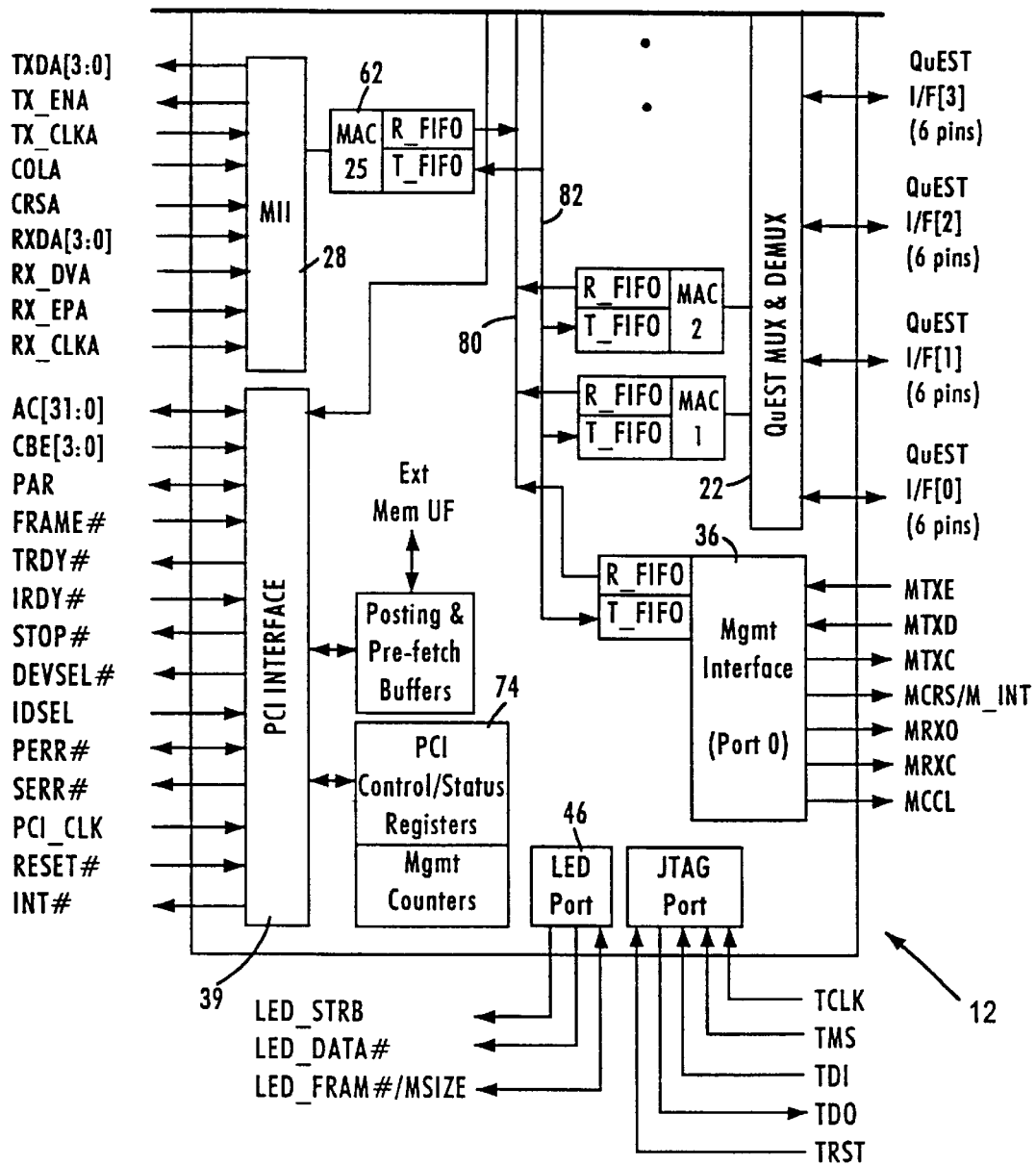

FIG. 2 is a more detailed block diagram example of the multiport switch 12 shown in FIG. 1. The multiport switch 12 includes twenty-four (24) 10 Mb/s media access control (MAC) ports 60 for sending and receiving data packets in full-duplex/half duplex between the respective 10 Mb/s network stations 14 (ports 1–24), and two 100 Mb/s MAC ports 62 for sending and receiving data packets in full-duplex/half duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue and enables decisions to be made in an order independent from the order in which the frames were received by the multiport switch 12 and decision making based on a larger amount of data from the begining of the frame-(up to 64 bytes).

The internal rules checker 68 and external rules checker 44 provide the decision making logic for determining the destination MAC port for a given data packet. The decision making engine may indicate that a given data packet is to be output to either a single port, multiple ports, all ports (i.e., broadcast) or no ports (i.e., filtering. Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface also 72 outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

MIB information for each transmitted or received packet is generated by the MAC at each port. MIB objects (or MIBs) represent a plurality of transmission operational parameters that are considered to be statistically significant. Examples of such parameters are the following: The number of times a receive packet was dropped due to lack of resources in an IMS port, e.g., receive FIFO overflow. The number of bytes received by a port. The number of valid packets received by a port that are addressed to a broadcast address. The number of valid packets received by a port that are addressed to a multicast address. The number of valid packets received by a port that are not addressed to a multicast address or a broadcast address. The number of valid packets received by a port that are less than 64 bytes long and do not have any error. The number of valid packets received by a port that are less than 64 bytes long and do have an error. The number of received valid packets that are greater than a set value without error. The number of received valid packets that are greater than a set value with error. The number of times a packet was not transmitted due to lack of resources in an IMS port, e.g., transmit FIFO underrun. The number of bytes transmitted from a port. The number of packets transmitted from a port (with or without errors). The number of valid packets transmitted from a port that are addressed to a multicast address, or to a broadcast address. The number of collisions that occur on a port during transmission attempts. These examples are typical considerations and do not comprise an exhaustive catalog.

MIB report structures for transmission (xmt) and (rcv) reception are exemplified in the following tables.

Example of transmit report structure:

| Bits  | Parameters                              |
|-------|-----------------------------------------|
| 0     | xmt/rcv                                 |
| 5:1   | port #                                  |
| 16:6  | number of octets transmitted            |
| 18:17 | unicast 00; multicast 01; broadcast 10  |
| 19    | pause control packet (100 Mb/s)         |
| 20    | underrun                                |
| 24:21 | tagged packet or tagged port            |
| 25    | late collision                          |
| 26    | deferred transmit                       |
| 27    | pause control packet (100 Mb/s)         |
| 28    | tagged port & tagged frame              |

Example of receive report structure:

| Bits  | Parameters                              |
|-------|-----------------------------------------|
| 0     | xmt/rcv                                 |
| 5:1   | port #                                  |
| 16:6  | number of octets received               |
| 18:17 | unicast 00; multicast 01; broadcast 10  |
| 19    | pause control pkt (100 Mb/s port)       |
| 20    | tagged port & tagged frame              |
| 21    | alignment error                         |
| 22    | A PCS error                             |
| 23    | RESERVED                                |
| 24    | RESERVED                                |
| 25    | excessive size                          |
| 26    | receive FIFO overflow                   |

Figure 3:
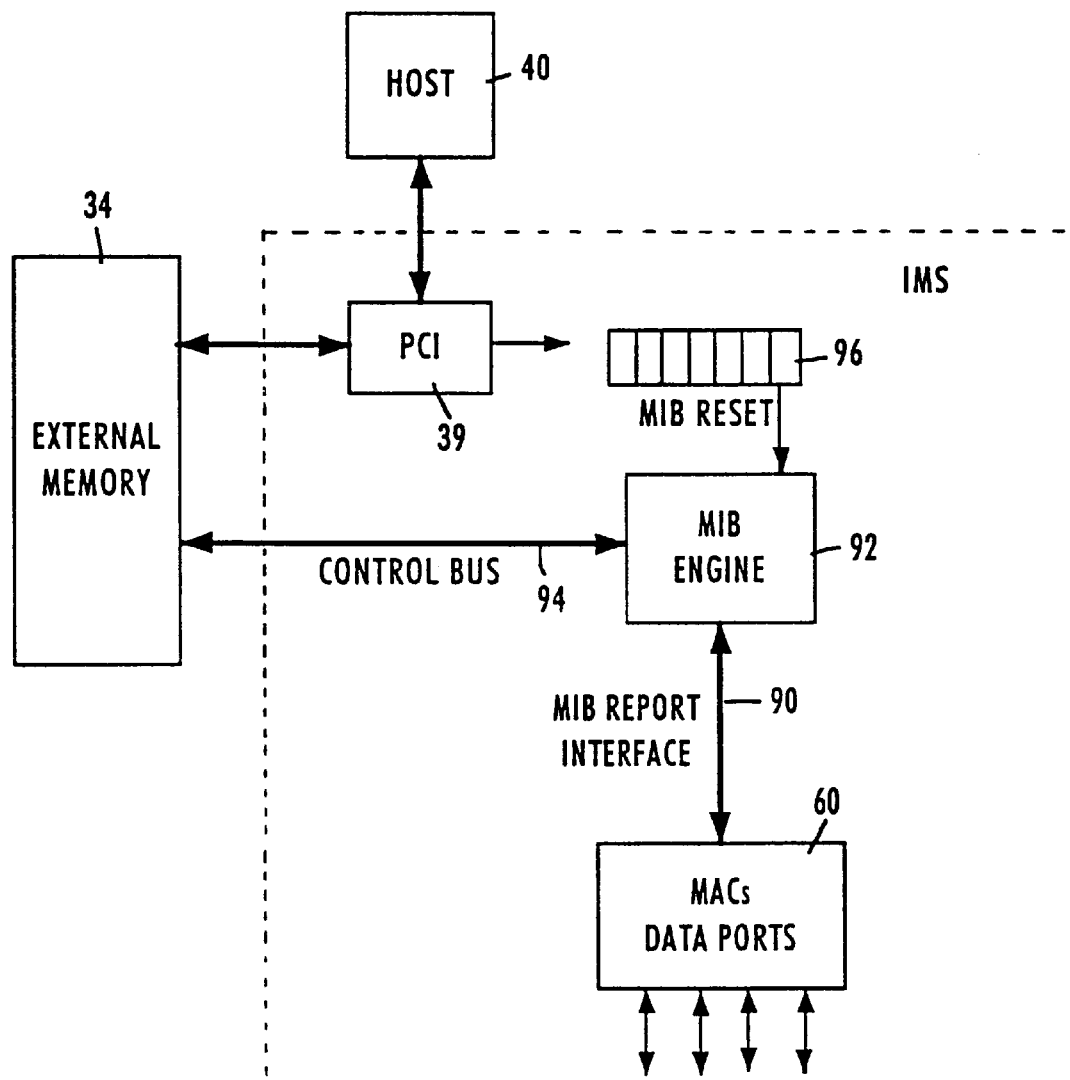
FIG. 3 is a partial block diagram relating to the processing and storage of MIB information.

The processing and storage of MIB information is illustrated by the partial block diagram of FIG. 3. The dotted line boundary delineates a portion of the IMS logic chip 12. Each of MACs 60, 62 and 36, collectively illustrated as a single block, generates a MIB report that details the transmission activity at its port. The report is then sent through a MIB report interface 90 to MIB engine 92. Each MIB report is formulated into a packet having bit locations, or fields, that correspond to particular MIB objects. Preferably, the first bit indicates whether the report refers to transmit or receive, successive bit locations identify the port number, and the remainder of the report packet bit locations are dedicated to the transmission variables, at least some of which are described above. For the embodiment illustrated in FIGS. 1 and 2, the IMS may have 34 MIBs per each 10 Mb/s port including the Management port, 36 MIBs per each 100 Mb/s port and one MIB for the whole chip.

Figure 4:
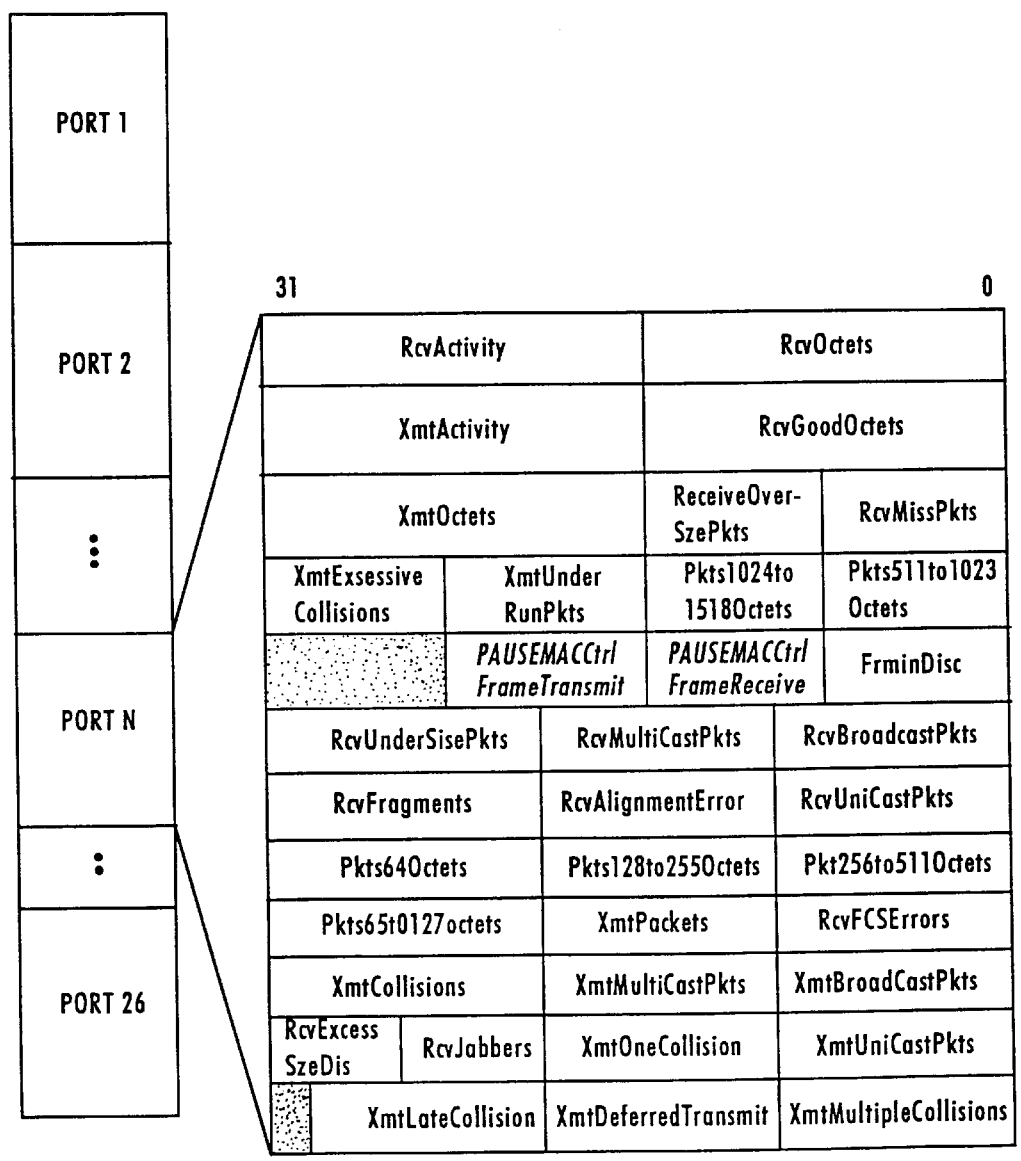
FIG. 4 is an example of data structure for the on-chip RAM storage in the MIB engine of FIG. 3 in accordance with the present invention.

The MIB engine will accumulate the received data in its own temporary RAM storage, associate the data with respective MIBs, and update MIB information in the external memory 34. The counters may be grouped in memory by port. A preferred data structure for the on-chip RAM storage is exemplified by FIG. 4. IMS MIB counters are mapped into the external memory 34 and are accessible to the PCI Host processor 40. Only the lower n bits of all port MIBs are maintained on-chip while the full versions are in the external memory, thereby conserving on-chip RAM space. The full-length MIBs in the external memory are periodically transferred to the chip via control bus 94 and are updated before they are written back to the external memory via the control bus.

The full-length MIB counters kept in the external memory can be accessed at any time, either by the external host or by the on-chip MIB engine for updating. Periodically, MIBs that belong to each port are brought into the IMS MIB engine to be updated. A round-robin schedule by port can be used with repetition every 45 msecs. On the average, for each msec, the MIBs that belong to one port are transferred from the external memory, are updated, and are written back. The number of bits kept on-chip for each MIB may be determined according to the worst case situations that can occur within this period.

Various tests may be performed to check the operation of the major MIB interfaces. Under control of the external host 40, a MIB reset packet can be transmitted through the PCI interface to register 96, contained in the PCI control/status registers block 74, illustrated in FIG. 2. Application thereafter to MIB engine 92 will clear the internal storage in the MIB engine. Basic tests can then be undertaken, for example, for checking the timings of the control bus, for checking proper operation of the PCI interface, and for checking MIB updating operations. More advanced tests involve introducing multiple MIB reports as fast as possible in back to back fashion and checking for errors in the results read out. These MIB reports may be introduced either by a port from an external source. Further tests can be performed under varying conditions.

Figure 5:
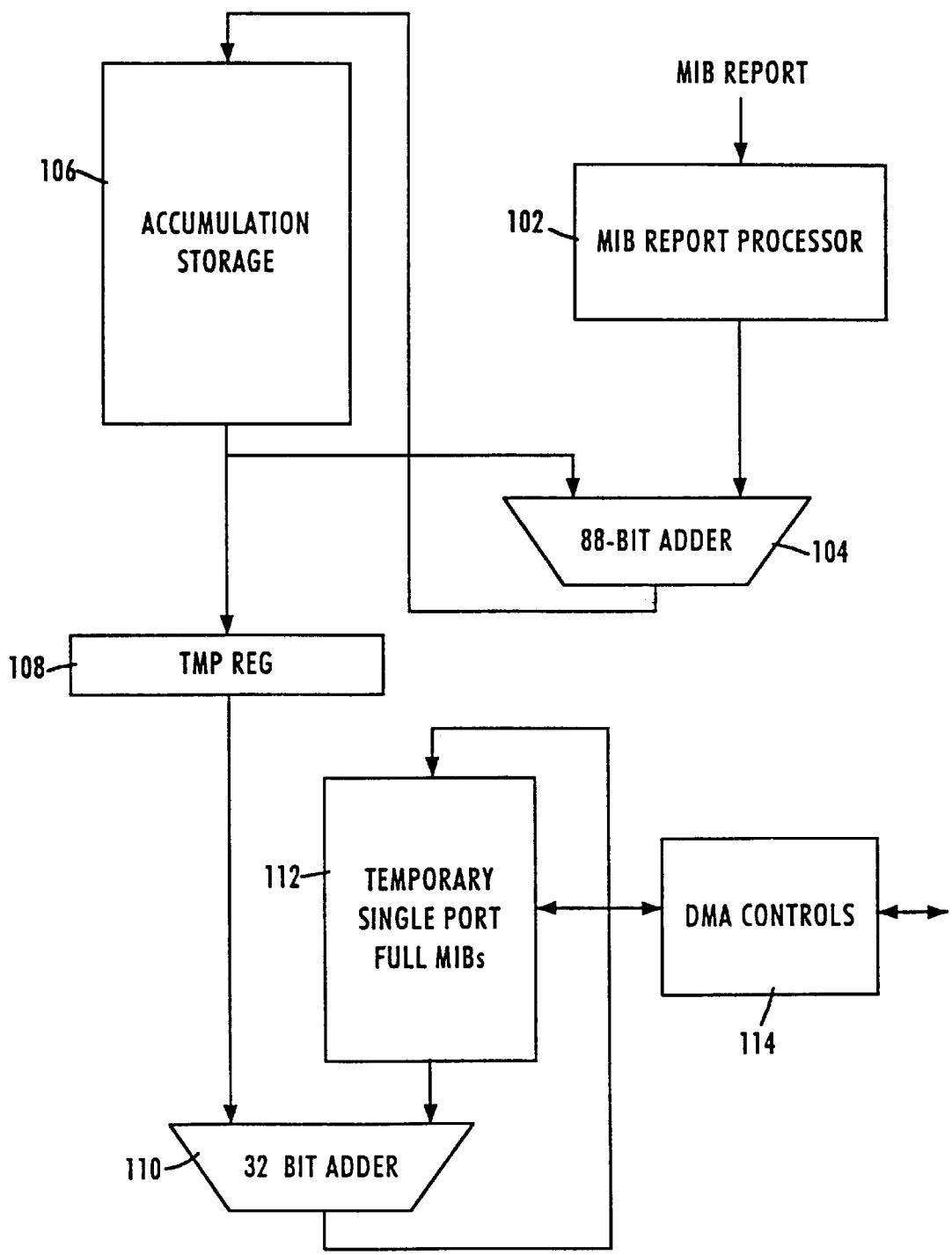
FIG. 5 is a block diagram of the MIB engine 92, shown in FIG. 3.

FIG. 5 is a block diagram of the MIB engine 92, shown in FIG. 3. MIB report processor 102 has an input for receiving MIB reports from the MIB report interface. The output of the MIB report processor is connected to 88-bit adder 104. The 88-bit adder has a second input connected to accumulation storage 106. Accumulation storage 106 may comprise registers, such as flip-flop counters that can contain 16.2 $\mu$secs worth of events. The output of 88-bit adder is connected to the input of accumulation storage 106. Temporary register 108 is configured to receive output from accumulation storage 106 and to feed a first input of 32 bit adder 110. A second input to the 32 bit adder is configured to receive input from full MIBs temporary single port store 112. Store 112, which may comprise RAM memory, serves as a buffer mailbox for full length MIBs to be transferred to, or received from, the external memory. Inputs to the 32 bit adder are received from the output of the 32 bit adder and the external memory via DMA control 114.

In operation, a MIB report is received in the MIB engine by the MIB report processor 102. The MIB report processor expands the MIB report into the various MIB objects that make up the MIB set, basically by decoding the bits into internal registers. An appropriate row from accumulation storage 106, for the corresponding MAC port and set of MIBs reported, is applied to 88-bit adder 104. The MIB report data is added and the contents are then written back to accumulation storage 106. While this process is represented in the drawing figure by single lines, a number of MIB additions preferably can be performed in parallel for the particular MIB fields to be updated. The adder can be internally structured to include several adders in parallel to total 88 bit addition. Parallel processing in this manner can accommodate the fast rate at which MIB reports from the plurality of MAC ports are received.

While the capacity of the accumulation storage is limited to conserve chip space, sufficient storage is provided to process several MIB reports. The number of bits kept on-chip for each MIB is determined according to the worst case situations that can occur within the 45 msec MIB report period. On the average, every 1 msec the MIBs that belong to one port are transferred from external memory, are updated in the MIB engine, and written back to external memory. As an example of the internal structure of the accumulation storage, four 88 bit rows can be allocated for the data of each port. The length of each segment that accommodates a MIB field may vary in relation to MIB size. The parallel processing of the 88 bit adder can thus direct the MIBs of the row retrieved from accumulation storage to each of the parallel adders within the 88 bit adder.

The external memory 34 is accessed via external memory interface 32, shown in FIG. 2, through DMA controller 114. Each time the full-length MIBs of one port are ready to be updated inside the chip, the portion that maps to this particular port is accessed from the external memory and temporarily loaded to single port store 112. This data is read line by line into 32 bit adder 110 to which the accumulated new MIB report data, input from temporary register 108, is added. This addition is applied to one or more MIBs at a time that can be accommodated by the 32 bit width of the adder. The updated values are written back in the temporary single port store before being transferred back to external memory. The contents of the accumulation storage portion allocated to the updated port information is emptied upon updating. The updating process occurs for each port in turn and repeated continually to ensure that the accumulation storage does not overflow.

The present invention thus advantageously provides a multiport switch from which an increased quantity of MIB information may be obtained in fast and efficient manner. A minimum of on-chip space is provided for temporary MIB storage and interaction with external memory for continual updating.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. In an integrated multiport network switch comprising an integrated chip having a plurality of ports for transmitting data to and receiving data from a data network, each port having associated therewith a media access controller (MAC), a method comprising the steps of:

generating management information base (MIB) data at the MAC of one of said ports, said MIB data being related to predefined parameters for each transmission of data and reception of data at the respective port;

accumulating said MIB data generated by each MAC in temporary storage on said chip; and periodically updating a memory external to said chip with the MIB data temporarily accumulated, wherein said generating step comprises:

forming a MIB report frame having a prescribed format in which each predefined parameter is allocated to a respective field of the report frame, said temporary storage having portions allocated to said predefined parameters for respective ports; and said accumulating step comprises:

adding data from the MIB report frame to corresponding portions of said temporary storage.

2. A method as recited in claim 1, wherein said external memory stores a count for each predefined parameter and said updating step comprises:

accessing said external memory for data stored therein for said one port;

receiving on-chip the data accessed in said accessing step;

adding the accumulated MIB data in said temporary storage to the received accessed data to obtain update data;

replacing data in said external memory with said update data; and resetting the portion of said temporary storage that is allocated to said one port.

3. A method as recited in claim 1, wherein the fields allocated to said packet are variable in length and the capacity of said temporary storage is a function of the length of the fields.

4. A method as recited as in claim 1, wherein said steps of generating, accumulating and updating are repeated periodically in turn for each of said ports.

5. A method as recited in claim 4, wherein the step of updating the accumulated MIB data is repeated at a time period during which a plurality of MIB reports for said one port have been accumulated in said accumulating step.

6. A method as recited in claim 1, further comprising the steps of:

resetting said temporary storage in response to an external host signal; and performing tests on components of said chip relating to said management information base under external control.

7. A method as recited in claim 1, wherein said data network is a packet data network and each said MAC controls transmission of packets to and receipt of packets from the network at a respective one of said ports.

8. A method as recited in claim 3, wherein the MIB data generated in said generating step and accumulated in said accumulating step are in compressed form, and the data replaced in said replacing step is in uncompressed form.

9. An integrated multiport network switch for interfacing with a data network and having a logic chip comprising:

a plurality of ports for transmitting data to and receiving data from said data network;

a media access controller (MAC) associated with each said port for generating management information base (MIB) data related to predefined parameters for each transmission of data and reception of data at the respective port; and an on-chip management information base (MIB) engine connected to receive MIB data from each of said MACs for accumulating said MIB data and having an output for communicating with a memory external to said logic chip, wherein said MIB engine comprises:

storage for holding accumulated MIB data received from said MACs;

a MIB report processor for identifying portions of received MIB report data that are allocated to said predefined parameters for respective ports; and an adder for adding the received MIB report data to corresponding portions to said storage that are allocated to said predefined parameters.

10. A switch as recited in claim 9, wherein said MIB engine further comprises:

a direct memory access controller for controlling the communication of data between the MIB engine and said external memory;

a buffer for temporarily holding the communicated external memory data; and an adder for adding said accumulated data to said buffered data to result in combined data;

whereby said external memory is updated with the combined data.

* * * * *